United States Patent
Ikeno et al.

(10) Patent No.: US 10,833,265 B2
(45) Date of Patent: Nov. 10, 2020

(54) STORAGE DEVICE

(71) Applicant: TOSHIBA MEMORY CORPORATION, Tokyo (JP)

(72) Inventors: Daisuke Ikeno, Yokkaichi Mie (JP); Akihiro Kajita, Yokkaichi Mie (JP); Atsuko Sakata, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/556,057

(22) Filed: Aug. 29, 2019

(65) Prior Publication Data
US 2020/0303641 A1  Sep. 24, 2020

(30) Foreign Application Priority Data

Mar. 19, 2019 (JP) .................... 2019-052001

(51) Int. Cl.
*H01L 45/00* (2006.01)
*H01L 27/24* (2006.01)

(52) U.S. Cl.
CPC ...... *H01L 45/1293* (2013.01); *H01L 27/2463* (2013.01); *H01L 45/06* (2013.01); *H01L 45/1253* (2013.01); *H01L 45/141* (2013.01); *H01L 45/1625* (2013.01)

(58) Field of Classification Search
CPC ...................................... H01L 45/06
See application file for complete search history.

(56) References Cited

U.S. PATENT DOCUMENTS

| 8,981,334 | B1 | 3/2015 | Schubert et al. |
| 9,166,158 | B2 | 10/2015 | Lengade et al. |
| 9,406,881 | B1 | 8/2016 | Tortorelli et al. |
| 2008/0101109 | A1 | 5/2008 | Haring-Bolivar et al. |
| 2008/0173861 | A1 | 7/2008 | Choi et al. |
| 2015/0123066 | A1* | 5/2015 | Gealy ............... H01L 45/16 257/4 |
| 2018/0277601 | A1 | 9/2018 | Ahn et al. |

FOREIGN PATENT DOCUMENTS

| JP | 2008-153664 | 7/2008 |
| JP | 4971796 | 7/2012 |
| JP | 2018-164085 | 10/2018 |

* cited by examiner

*Primary Examiner* — Peniel M Gumedzoe
*Assistant Examiner* — Christopher A Johnson
(74) *Attorney, Agent, or Firm* — Foley & Lardner LLP (57) ABSTRACT

According to one embodiment, a storage device includes a first conductive layer, a second conductive layer, a resistance-variable layer, between the first conductive layer and the second conductive layer, that includes germanium, antimony, and tellurium, a first layer, between the resistance-variable layer and the first conductive layer, that includes carbon, a second layer, between the resistance-variable layer and the second conductive layer, that includes carbon, a third layer, between the resistance-variable layer and the first layer, that includes at least one of tungsten nitride or tungsten carbide, and a fourth layer, between the resistance-variable layer and the second layer, that includes at least one of tungsten nitride or tungsten carbide.

13 Claims, 9 Drawing Sheets

STORAGE DEVICE

CROSS-REFERENCE TO RELATED APPLICATION

This application is based upon and claims the benefit of priority from Japanese Patent Application No. 2019-052001, filed Mar. 19, 2019, the entire contents of which are incorporated herein by reference.

FIELD

Embodiments described herein relate generally to a storage device.

BACKGROUND

Two-terminal storage devices include a phase change memory (PCM). The phase change memory is able to implement a capacity and a speed range which are intermediate between a dynamic random access memory (DRAM) and a NAND flash memory, and is, therefore, attracting attention as a next-generation non-volatile storage device.

The phase change memory includes, for example, a resistance-variable element containing a chalcogenide. The phase change memory utilizes a resistance variation caused by a change of phase of the resistance-variable element. Specifically, the phase change memory utilizes a phenomenon in which the resistance-variable element becomes low in resistance when being in a crystalline state and becomes high in resistance when being in an amorphous state.

Joule heat, generated by the passage of an electric current through the resistance-variable element, can cause a change of phase in the resistance-variable element. When a voltage higher than or equal to a threshold voltage is applied to the resistance-variable element while the resistance-variable element is in an amorphous state, a large electric current flows through the resistance-variable element, so that Joule heat is generated and the temperature of the resistance-variable element is raised. Additionally, changing the resistance-variable element into a polycrystalline state to bring the resistance-variable element into a low resistance state by controlling the voltage applied to the resistance-variable element to keep the temperature of the resistance-variable element within a crystallization temperature range is referred to as a "setting operation." Moreover, changing the resistance-variable element into an amorphous state to bring the resistance-variable element into a high resistance state by applying a voltage to the resistance-variable element in a polycrystalline state to cause a large electric current to flow through the resistance-variable element, thus melting the resistance-variable element, and then rapidly decreasing the voltage to rapidly cool the resistance-variable element is referred to as a "resetting operation."

For example, the high resistance state of the resistance-variable element is defined as data "1", and the low resistance state thereof is defined as data "0". The resistance-variable element is capable of keeping respective different states thereof, and is thus able to store one-bit data indicating "1" or "0."

To achieve high reliability, the phase change memory is needed to have a large number of rewritable times, in other words, to have a high endurance property.

An example of related art includes U.S. Pat. No. 9,406,881.

DETAILED DESCRIPTION

Embodiments provide a storage device having an improved endurance property.

In general, according to one embodiment, a storage device includes a first conductive layer, a second conductive layer, a resistance-variable layer, provided between the first conductive layer and the second conductive layer, that includes germanium (Ge), antimony (Sb), and tellurium (Te), a first layer, provided between the resistance-variable layer and the first conductive layer, that primarily includes carbon, a second layer, provided between the resistance-variable layer and the second conductive layer, that primarily includes carbon, a third layer, provided between the resistance-variable layer and the first layer, that includes at least one of tungsten nitride with a nitrogen concentration of 10 atomic percent or more and 25 atomic percent or less or tungsten carbide with a carbon concentration of 4 atomic percent or more and 20 atomic percent or less, and a fourth layer, provided between the resistance-variable layer and the second layer, that includes at least one of tungsten nitride with a nitrogen concentration of 10 atomic percent or more and 25 atomic percent or less or tungsten carbide with a carbon concentration of 4 atomic percent or more and 20 atomic percent or less.

Hereinafter, embodiments of the present disclosure will be described with reference to the drawings. Furthermore, in the following description, for example, the same or similar members are assigned the respective same reference characters, and, for example, the members described once are omitted from description as needed.

Storage devices according to the respective embodiments are described below with reference to the drawings.

First Embodiment

A storage device according to a first embodiment includes a first conductive layer, a second conductive layer, a resistance-variable element (or resistance-variable layer) provided between the first conductive layer and the second conductive layer that including germanium (Ge), antimony (Sb), and tellurium (Te), a first layer provided between the resistance-variable element and the first conductive layer and primarily including carbon, a second layer provided between the resistance-variable element and the second conductive layer and primarily including carbon, a third layer provided between the resistance-variable element and the first layer and including tungsten nitride with a nitrogen concentration of 10 atomic percent or more and 25 atomic percent or less, and a fourth layer provided between the resistance-variable element and the second layer and including tungsten nitride with a nitrogen concentration of 10 atomic percent or more and 25 atomic percent or less.

Moreover, a storage device according to the first embodiment includes a plurality of first wirings, a plurality of second wirings intersecting with the plurality of first wirings, and memory cells located at regions in which each second wiring intersects with each first wiring, and each memory cell includes a first conductive layer, a second conductive layer, a resistance-variable element provided between the first conductive layer and the second conductive layer that includes at least one of germanium (Ge), antimony (Sb), or tellurium (Te), a first layer provided between the resistance-variable element and the first conductive layer and primarily including carbon, a second layer provided between the resistance-variable element and the second conductive layer and primarily including carbon, a third layer provided between the resistance-variable element and the first layer and including tungsten nitride with a nitrogen concentration of 10 atomic percent or more and 25 atomic percent or less, and a fourth layer provided between the resistance-variable element and the second layer and including tungsten nitride with a nitrogen concentration of 10 atomic percent or more and 25 atomic percent or less.

Figure 1:
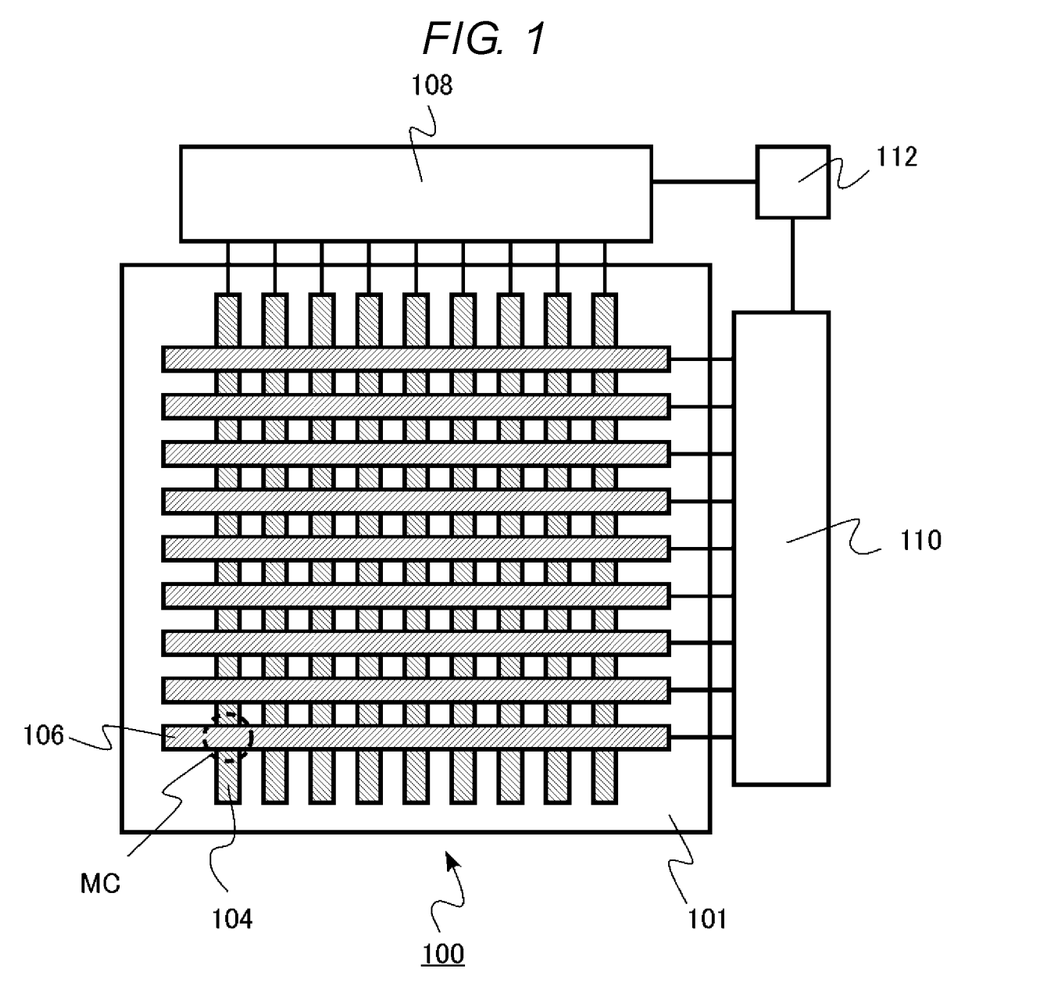
FIG. 1 is a block diagram of a storage device according to a first embodiment.
Figure 2:
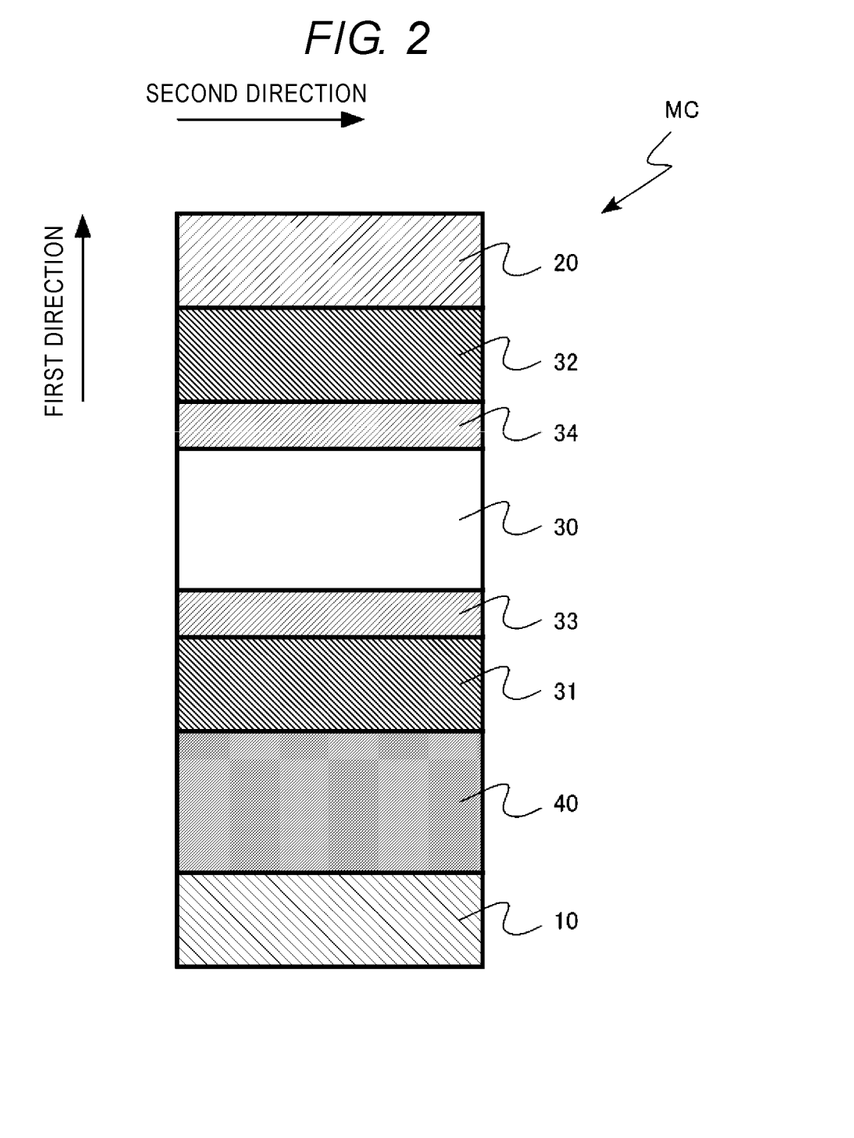
FIG. 2 is a schematic sectional view of a memory cell of the storage device according to the first embodiment.

FIG. 1 is a block diagram of the storage device according to the first embodiment. FIG. 2 is a schematic sectional view of a memory cell of the storage device according to the first embodiment. FIG. 2 illustrates a cross-section of one memory cell MC, which is indicated by, for example, a dotted line circle, in a memory cell array 100 illustrated in FIG. 1.

The memory cell array 100 of the storage device according to the first embodiment includes, for example, on a semiconductor substrate 101, a plurality of word lines 104 (i.e., first wirings) and a plurality of bit lines 106 (i.e., second wirings), which intersect with the word lines 104. The bit lines 106 are provided in a layer upper than that of the word lines 104. Moreover, a first control circuit 108, a second control circuit 110, and a sense circuit 112 are provided as peripheral circuits around the memory cell array 100.

A plurality of memory cells MC are provided in the respective regions in which one of the word lines 104 and one of the bit lines 106 intersect. The storage device according to the first embodiment is a two-terminal phase change memory having a cross-point structure.

The plurality of word lines 104 are respectively connected to the first control circuit 108. Moreover, the plurality of bit lines 106 are respectively connected to the second control circuit 110. The sense circuit 112 is connected to the first control circuit 108 and the second control circuit 110.

The first control circuit 108 and the second control circuit 110 can, for example, select a desired memory cell MC and write data to the memory cell MC, read data from the memory cell MC, and erase data from the memory cell MC. During reading data, the data stored in the memory cell MC is read out as the amount of electric current flowing between each word line 104 and each bit line 106. The sense circuit 112 can detect the read-out amount of electric current to determine the polarity of data. For example, the sense circuit 112 determines whether the data is "0" or "1."

The first control circuit 108, the second control circuit 110, and the sense circuit 112 are configured with, for example, an electronic circuit formed on the semiconductor substrate 101 with use of a semiconductor device.

The memory cell MC includes, as illustrated in FIG. 2, a lower electrode 10 (e.g., a first conductive layer), an upper electrode 20 (e.g., a second conductive layer), a resistance-variable element (or resistance-variable layer) 30, a first thermal shield layer 31 (e.g., a first layer), a second thermal shield layer 32 (e.g., a second layer), a first interfacial layer 33 (e.g., a third layer), a second interfacial layer 34 (e.g., a fourth layer), and a switching element (or switching layer) 40.

Hereinafter, the direction extending from the lower electrode 10 toward the upper electrode 20 is defined as a first direction. Moreover, the direction perpendicular to the first direction is defined as a second direction.

The lower electrode 10 is connected to the word line 104. The lower electrode 10 is made from, for example, metal. The lower electrode 10 is made from, for example, titanium (Ti), tungsten (W), tantalum (Ta), platinum (Pt), or a nitride thereof. The lower electrode 10 is made from, for example, titanium nitride. The lower electrode 10 may be configured to be a part of the word line 104.

The upper electrode 20 is connected to the bit line 106. The upper electrode 20 is made from, for example, metal. The upper electrode 20 is made from, for example, titanium (Ti), tungsten (W), tantalum (Ta), platinum (Pt), or a nitride thereof. The upper electrode 20 is made from, for example, titanium nitride. The upper electrode 20 may be configured to be a part of the bit line 106.

The resistance-variable element 30 is provided between the lower electrode 10 and the upper electrode 20. The resistance-variable element 30 has a function of storing data using a resistance variation.

The resistance-variable element 30 includes, for example, germanium (Ge), antimony (Sb), and tellurium (Te). The resistance-variable element 30 is a chalcogenide film including germanium (Ge), antimony (Sb), and tellurium (Te) (hereinafter also referred to as a "GST film").

The resistance-variable element 30 is a chalcogenide film formed by, for example, a physical vapor deposition method (PVD method). The thickness of the resistance-variable element 30 in the first direction is, for example, 20 nm or more and 50 nm or less.

The first thermal shield layer 31 is provided between the resistance-variable element 30 and the lower electrode 10. The first thermal shield layer 31 primarily includes carbon.

Primarily including carbon means that the atomic concentration of carbon is the highest of those of atoms contained in the first thermal shield layer 31. The carbon concentration of the first thermal shield layer 31 is, for example, 90 atomic percent or more.

The first thermal shield layer 31 is, for example, a carbon film formed by the PVD method. The thickness of the first thermal shield layer 31 in the first direction is, for example, 10 nm or more and 30 nm or less.

The first thermal shield layer 31 has a function of blocking thermal conduction between the resistance-variable element 30 and the lower electrode 10 to improve the heat generation efficiency of the resistance-variable element 30.

The second thermal shield layer 32 is provided between the resistance-variable element 30 and the upper electrode 20. The second thermal shield layer 32 primarily includes carbon.

Primarily including carbon means that the atomic concentration of carbon is the highest of those of atoms contained in the second thermal shield layer 32. The carbon concentration of the second thermal shield layer 32 is, for example, 90 atomic percent or more.

The second thermal shield layer 32 is, for example, a carbon film formed by the PVD method. The thickness of the second thermal shield layer 32 in the first direction is, for example, 10 nm or more and 30 nm or less.

The second thermal shield layer 32 has a function of blocking thermal conduction between the resistance-variable element 30 and the upper electrode 20 to improve the heat generation efficiency of the resistance-variable element 30.

The first interfacial layer 33 is provided between the resistance-variable element 30 and the first thermal shield layer 31. The first interfacial layer 33 is in contact with, for example, the resistance-variable element 30 and the first thermal shield layer 31.

The first interfacial layer 33 includes tungsten nitride with a nitrogen concentration of 10 atomic percent or more and 25 atomic percent or less. The first interfacial layer 33 is, for example, a tungsten nitride film formed by the PVD method. The thickness of the first interfacial layer 33 in the first direction is, for example, 1 nm or more and 10 nm or less.

The nitrogen concentration of the first interfacial layer 33 is able to be controlled by, for example, adjusting the flow rate of nitrogen gas during sputtering film formation when a tungsten nitride film is formed by a reactive sputtering method.

The second interfacial layer 34 is provided between the resistance-variable element 30 and the second thermal shield layer 32. The second interfacial layer 34 is in contact with, for example, the resistance-variable element 30 and the second thermal shield layer 32.

The second interfacial layer 34 contains tungsten nitride with a nitrogen concentration of 10 atomic percent or more and 25 atomic percent or less. The second interfacial layer 34 is, for example, a tungsten nitride film formed by the PVD method. The thickness of the second interfacial layer 34 in the first direction is, for example, 1 nm or more and 10 nm or less.

The nitrogen concentration of the second interfacial layer 34 is able to be controlled by, for example, adjusting the flow rate of nitrogen gas during sputtering film formation when a tungsten nitride film is formed by the reactive sputtering method.

The switching element 40 is provided between the first thermal shield layer 31 and the lower electrode 10. The switching element 40 contains germanium (Ge), selenium (Se), and arsenic (As). The switching element 40 is a chalcogenide film including germanium (Ge), selenium (Se), and arsenic (As).

The switching element 40 is, for example, a chalcogenide film formed by the PVD method. The thickness of the switching element 40 in the first direction is, for example, 5 nm or more and 30 nm or less.

The switching element 40 has a non-linear current-voltage characteristic in which a current steeply rises up at the time of a specific voltage (i.e., a threshold voltage). The switching element 40 has a function of preventing or reducing an increase in a semi-selected leak current flowing through a semi-selected cell. The switching element 40 is what is called an ovonic threshold switch (OTS).

The types of atoms contained in each layer or each film configuring the memory cell MC are able to be measured by, for example, an energy dispersive X-ray spectroscopy (EDX) or a secondary ion mass spectrometry (SIMS). The atomic concentration of each atom contained in each layer or each film is able to be measured by, for example, the SIMS.

The thickness of each layer or each film is able to be measured by, for example, a transmission electron microscope (TEM).

Next, an action and an effect of the storage device according to the first embodiment are described.

In the phase change memory, Joule heat which is generated by the passage of an electric current through the resistance-variable element causes a change of phase in the resistance-variable element. When a voltage higher than or equal to a threshold voltage is applied to the resistance-variable element while the resistance-variable element is in an amorphous state, a large electric current flows through the resistance-variable element, so that Joule heat is generated and the temperature of the resistance-variable element is thus raised. Additionally, changing the resistance-variable element into a polycrystalline state to bring the resistance-variable element into a low resistance state by controlling the voltage which is applied to the resistance-variable element to keep the temperature of the resistance-variable element within a crystallization temperature range is referred to as a "setting operation". Moreover, changing the resistance-variable element into an amorphous state to bring the resistance-variable element into a high resistance state by applying a voltage to the resistance-variable element in a polycrystalline state to cause a large electric current to flow through the resistance-variable element, thus melting the resistance-variable element, and then rapidly decreasing the voltage to rapidly cool the resistance-variable element is referred to as a "resetting operation".

For example, the high resistance state of the resistance-variable element is defined as data "1", and the low resistance state thereof is defined as data "0". The resistance-variable element is capable of keeping respective different states thereof, and is thus able to store one-bit data indicating "1" or "0".

In the phase change memory in which a GST film is used as a resistance-variable element, with a view to making an operating voltage thereof lower and reducing power consumption, a resetting current which is needed for the resetting operation is required to be reduced. Providing a thermal shield layer above the GST film enables improving the heat generation efficiency of the GST film. It is considered that it is possible to reduce the resetting current by improving the heat generation efficiency of the GST film. For example, a carbon film, which is a conductive film with a low thermal conductivity, may be used as the thermal shield layer.

However, if a carbon film is used as the thermal shield layer, although it is possible to attain a reduction in the resetting current, the endurance property deteriorates. For example, the endurance property becomes extremely low in such a manner that the number of rewritable times is $10^5$ times or less. The interdiffusion of atoms between the GST film and the carbon film is considered as a cause of deterioration of the endurance property.

Figure 3:
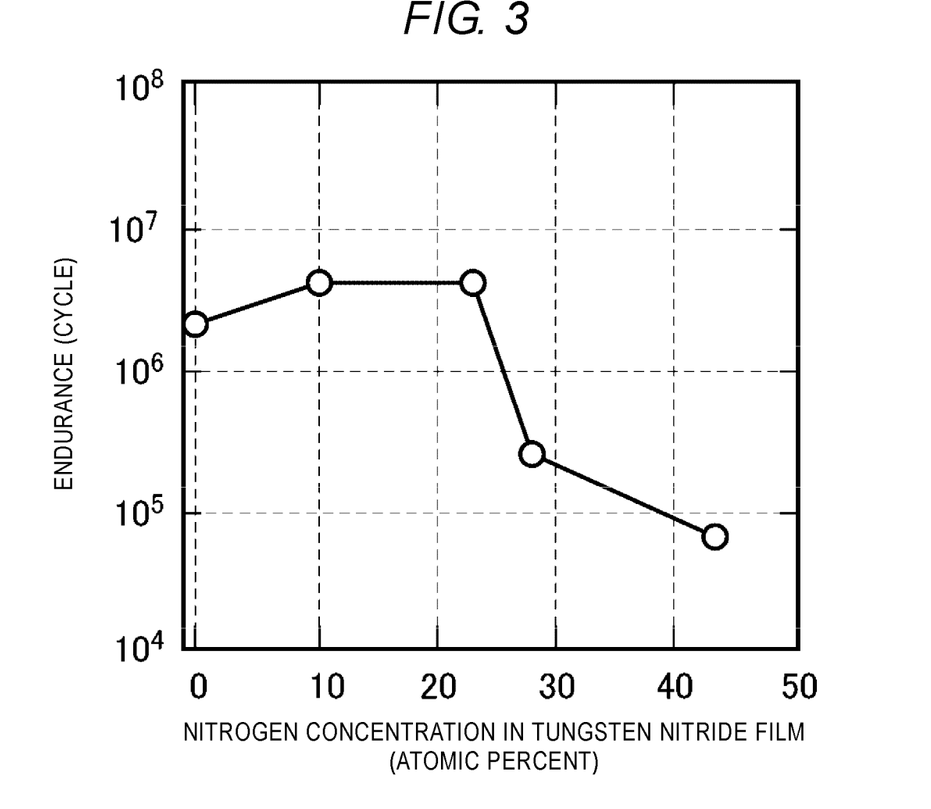
FIG. 3 is an explanatory diagram for an action and an effect of the storage device according to the first embodiment.

FIG. 3 is an explanatory diagram for an action and an effect of the storage device according to the first embodiment. FIG. 3 illustrates an endurance property obtained when a tungsten nitride film is interposed between the GST film and the carbon film.

The horizontal axis in FIG. 3 indicates a nitrogen concentration contained in the tungsten nitride film, and the vertical axis therein indicates endurance (i.e., the number of rewritable times). Data obtained when the nitrogen concentration is 0% corresponds to a case where a pure tungsten film is used.

As can be seen in FIG. 3, when the nitrogen concentration in the tungsten nitride film is 10 atomic percent or more and 25 atomic percent or less, a good endurance property is obtained.

Figure 4:
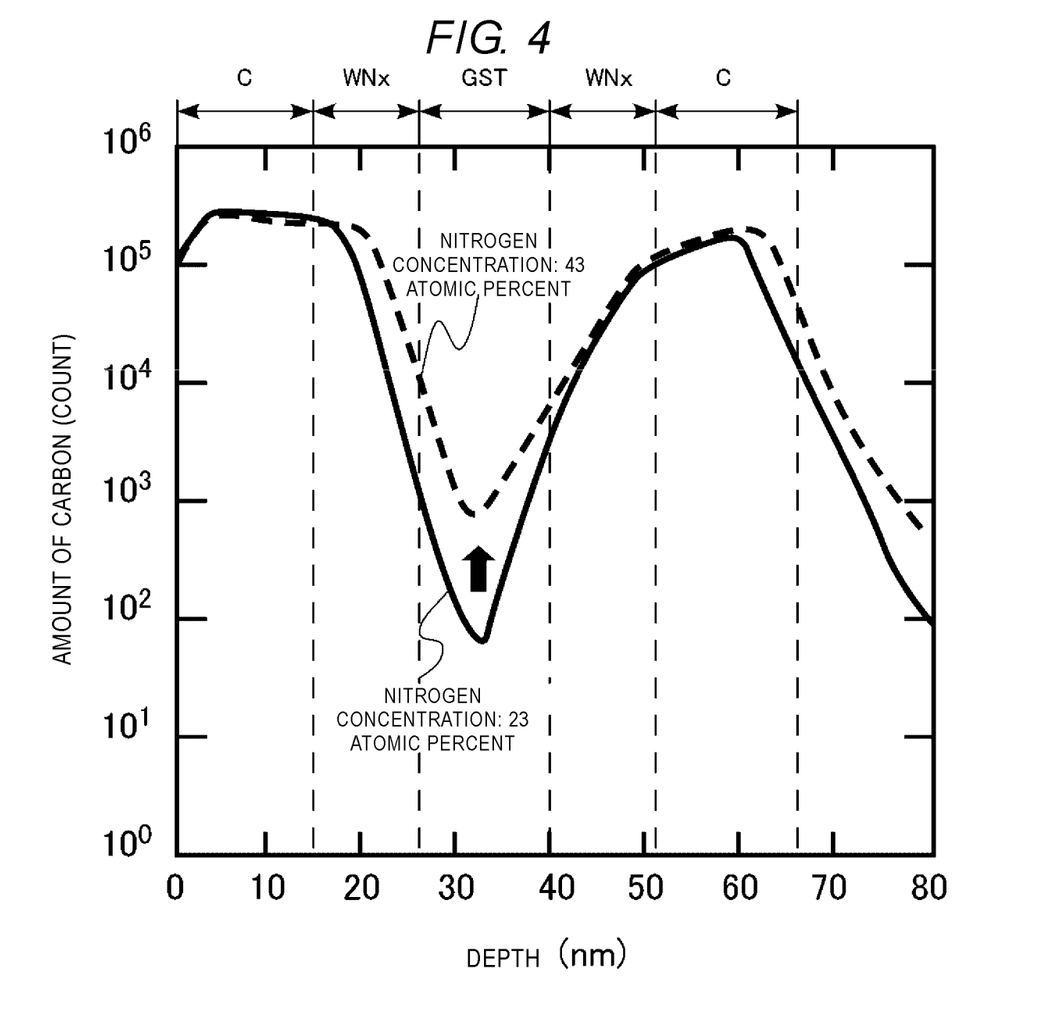
FIG. 4 is an explanatory diagram for an action and an effect of the storage device according to the first embodiment.

FIG. 4 is an explanatory diagram for an action and an effect of the storage device according to the first embodiment. FIG. 4 illustrates a distribution of carbon obtained when a thermal process of 450° C. is applied after stacking of a layered structure including a carbon film (C), a tungsten nitride film (WNx), a GST film (GST), a tungsten nitride film (WNx), and a carbon film (C), as with the phase change memory in the first embodiment. The horizontal axis indicates a depth that is based on the upper surface of the upper carbon film, and the vertical axis indicates the number of counts of carbon by the SIMS.

A distribution of carbon obtained when the nitrogen concentration contained in the tungsten nitride film is 23 atomic percent is indicated by the solid line, and a distribution of carbon obtained when the nitrogen concentration contained in the tungsten nitride film is 43 atomic percent is indicated by the dashed line. It can be seen that, as the nitrogen concentration is higher, the amount of carbon contained in the GST film is larger. It is considered that the carbon contained in the carbon film diffuses in the tungsten nitride film and then diffuses to inside the GST film. It is considered that, since, as the nitrogen concentration of the tungsten nitride film becomes higher, the carbon concentration of the GST film becomes higher, the endurance property deteriorates.

The tungsten nitride film is microcrystallized when the nitrogen concentration thereof is 10% or more. The tungsten nitride film is polycrystallized when the nitrogen concentration thereof exceeds 40%. Moreover, in the tungsten nitride film, when the nitrogen concentration thereof is less than 10%, the proportion taken by the polycrystallized tungsten becomes high.

It is considered that, when the proportion of microcrystalline of the tungsten nitride film is high, diffusion of carbon to the GST film caused by grain boundary diffusion of crystalline grains is prevented or reduced and the endurance property is thus improved. Accordingly, it is considered that, when the proportion of microcrystalline of the tungsten nitride film is high, e.g., when the nitrogen concentration thereof is 10 atomic percent or more and 25 atomic percent or less, a high endurance property can be attained.

In the storage device according to the first embodiment, including the first thermal shield layer 31 and the second thermal shield layer 32, each of which primarily includes carbon, reduces a resetting current. Then, including the first interfacial layer 33 and the second interfacial layer 34, each of which includes tungsten nitride with a specific nitrogen concentration range, enables attaining a storage device with an improved endurance property.

With a view to improving an endurance property, the nitrogen concentration of each of the first interfacial layer 33 and the second interfacial layer 34 can be 12 atomic percent or more and 23 atomic percent or less.

With a view to reducing a resetting current, the carbon concentration of each of the first thermal shield layer 31 and the second thermal shield layer 32 can be 90 atomic percent or more, and can even be 95 atomic percent or more.

As described above, according to the storage device in the first embodiment, a storage device with an improved endurance property can be attained.

Second Embodiment

A storage device in a second embodiment differs from that in the first embodiment in that the third layer includes tungsten carbide with a carbon concentration of 4 atomic percent or more and 20 atomic percent or less and the fourth layer includes tungsten carbide with a carbon concentration of 4 atomic percent or more and 20 atomic percent or less. In the following description, contents which overlap those in the first embodiment are partially omitted from description.

Figure 5:
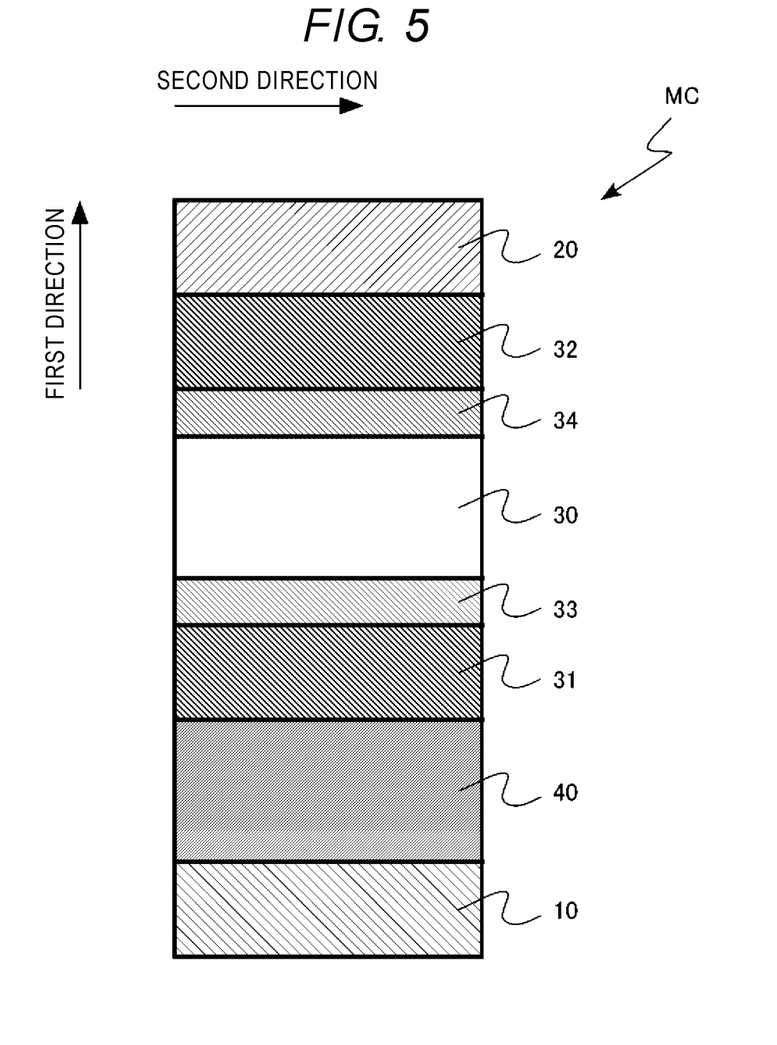
FIG. 5 is a schematic sectional view of a memory cell of a storage device according to a second embodiment.

FIG. 5 is a schematic sectional view of a memory cell of the storage device according to the second embodiment. FIG. 5 illustrates a cross-section of one memory cell MC, which is indicated by, for example, a dotted line circle, in the memory cell array 100 illustrated in FIG. 1.

The memory cell MC includes, as illustrated in FIG. 5, a lower electrode 10 (i.e., a first conductive layer), an upper electrode 20 (i.e., a second conductive layer), a resistance-variable element 30, a first thermal shield layer 31 (i.e., a first layer), a second thermal shield layer 32 (i.e., a second layer), a first interfacial layer 33 (i.e., a third layer), a second interfacial layer 34 (i.e., a fourth layer), and a switching element 40.

The first interfacial layer 33 is provided between the resistance-variable element 30 and the first thermal shield layer 31. The first interfacial layer 33 is in contact with, for example, the resistance-variable element 30 and the first thermal shield layer 31.

The first interfacial layer 33 includes tungsten carbide with a carbon concentration of 4 atomic percent or more and 20 atomic percent or less. The first interfacial layer 33 is, for example, a tungsten carbide film formed by the PVD method. The thickness of the first interfacial layer 33 in the first direction is, for example, 1 nm or more and 10 nm or less.

The carbon concentration of the first interfacial layer 33 is able to be controlled by, for example, using a tungsten carbide target with a composition of carbon previously adjusted when a tungsten carbide film is formed by a sputtering method.

The second interfacial layer 34 is provided between the resistance-variable element 30 and the second thermal shield layer 32. The second interfacial layer 34 is in contact with, for example, the resistance-variable element 30 and the second thermal shield layer 32.

The second interfacial layer 34 includes tungsten carbide with a carbon concentration of 4 atomic percent or more and 20 atomic percent or less. The second interfacial layer 34 is, for example, a tungsten carbide film formed by the PVD method. The thickness of the second interfacial layer 34 in the first direction is, for example, 1 nm or more and 10 nm or less.

The carbon concentration of the second interfacial layer 34 is able to be controlled by, for example, using a tungsten carbide target with a composition of carbon previously adjusted when a tungsten carbide film is formed by the sputtering method.

Figure 6:
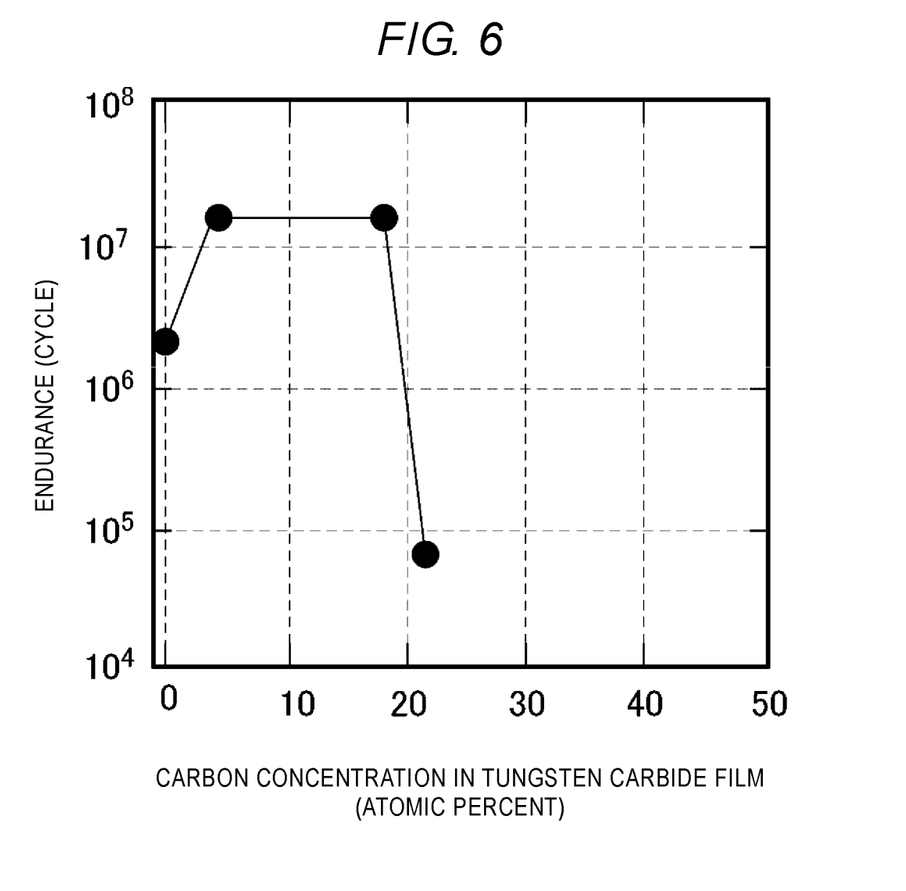
FIG. 6 is an explanatory diagram for an action and an effect of the storage device according to the second embodiment.

FIG. 6 is an explanatory diagram for an action and an effect of the storage device according to the second embodiment. FIG. 6 illustrates an endurance property obtained when a tungsten carbide film is interposed between the GST film and the carbon film.

The horizontal axis in FIG. 6 indicates a carbon concentration contained in the tungsten carbide film, and the vertical axis therein indicates endurance (i.e., the number of rewritable times). Data obtained when the carbon concentration is 0% corresponds to a case where a pure tungsten film is used.

As can be seen in FIG. 6, when the carbon concentration in the tungsten carbide film is 4 atomic percent or more and atomic percent or less, a good endurance property is obtained.

Figure 7:
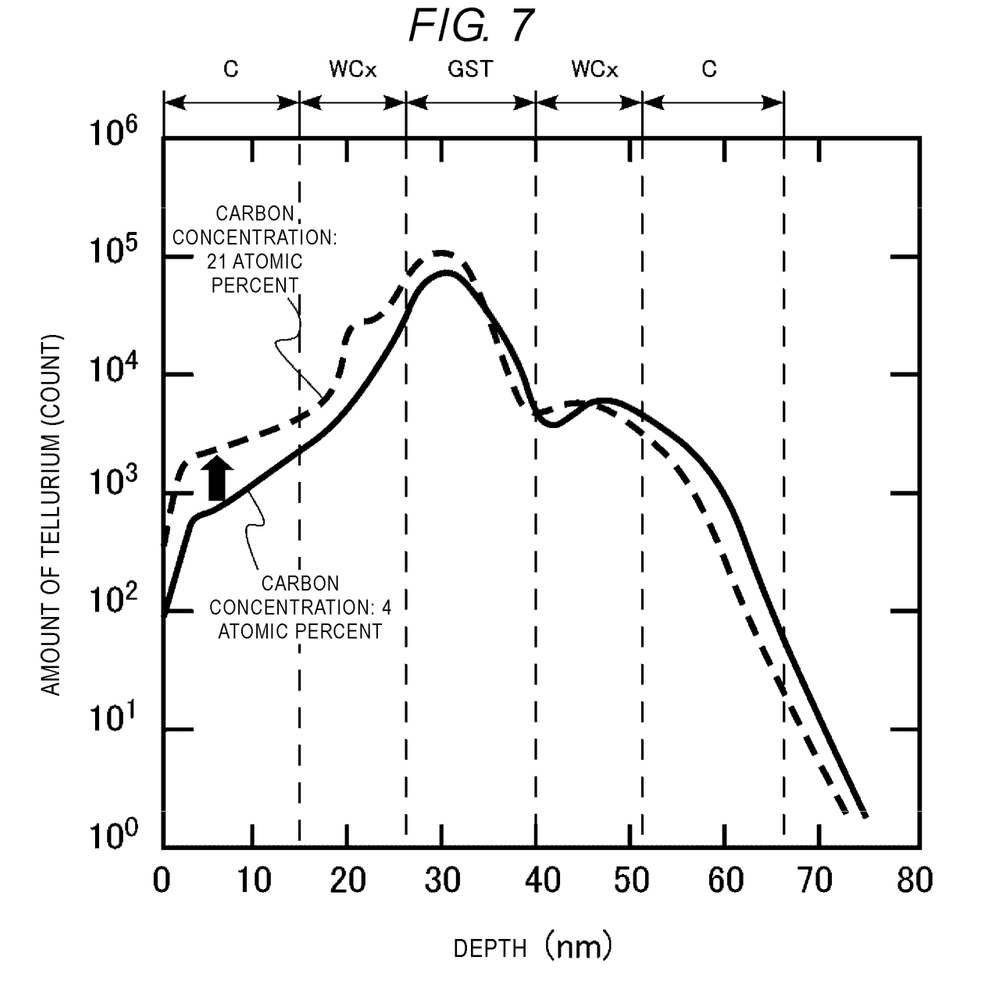
FIG. 7 is an explanatory diagram for an action and an effect of the storage device according to the second embodiment.

FIG. 7 is an explanatory diagram for an action and an effect of the storage device according to the second embodiment. FIG. 7 illustrates a distribution of tellurium obtained when a thermal process of 450° C. is applied after stacking of a layered structure including a carbon film (C), a tungsten carbide film (WCx), a GST film (GST), a tungsten carbide film (WCx), and a carbon film (C), as with the phase change memory in the second embodiment. The horizontal axis indicates a depth that is based on the upper surface of the upper carbon film, and the vertical axis indicates the number of counts of tellurium by the SIMS.

A distribution of tellurium obtained when the carbon concentration contained in the tungsten carbide film is 4 atomic percent is indicated by the solid line, and a distribution of tellurium obtained when the carbon concentration contained in the tungsten carbide film is 21 atomic percent is indicated by the dashed line. It can be seen that, as the carbon concentration is higher, the amount of tellurium contained in the upper carbon film is larger. It is considered that the tellurium contained in the GST film diffuses in the tungsten carbide film and then diffuses to inside the carbon film. It is considered that, since, when the carbon concentration of the tungsten carbide film becomes high, the tellurium contained in the GST film leaves, the endurance property deteriorates.

It is considered that, when the carbon concentration of the tungsten carbide film becomes high, drawing-out of tellurium from the GST film by carbon contained in the tungsten carbide film is accelerated. Accordingly, it is considered that, since the tellurium contained in the GST film leaves, the endurance property deteriorates.

Moreover, the tungsten carbide film is microcrystallized when the carbon concentration thereof is 4% or more. In the tungsten carbide film, when the carbon concentration thereof is less than 4%, the proportion taken by the polycrystallized tungsten becomes high. It is considered that, when the proportion of microcrystalline of the tungsten carbide film is high, drawing-out of tellurium from the GST film caused by grain boundary diffusion of crystalline grains is prevented or reduced and the endurance property is thus improved.

Accordingly, it is considered that, when the proportion of microcrystalline of the tungsten carbide film is high, i.e., when the carbon concentration thereof is 4 atomic percent or more, and when drawing-out of tellurium from the GST film is unlikely to occur, i.e., when the carbon concentration thereof is 20 atomic percent or less, a high endurance property can be attained.

In the storage device according to the second embodiment, including the first thermal shield layer 31 and the second thermal shield layer 32, each of which primarily includes carbon, reduces a resetting current. Then, including the first interfacial layer 33 and the second interfacial layer 34, each of which includes tungsten carbide with a specific carbon concentration range, enables attaining a storage device with an improved endurance property.

With a view to improving an endurance property, the carbon concentration of each of the first interfacial layer 33 and the second interfacial layer 34 can be 5 atomic percent or more and 18 atomic percent or less.

With a view to reducing a resetting current, the carbon concentration of each of the first thermal shield layer 31 and the second thermal shield layer 32 can be 90 atomic percent or more, and can even be 95 atomic percent or more.

As described above, according to the storage device in the second embodiment, a storage device with an improved endurance property can be attained.

Third Embodiment

A storage device in a third embodiment differs from that in the first embodiment in that, when the direction extending from the first conductive layer toward the second conductive layer is defined as a first direction, the thickness of the first layer in the first direction is greater than the thickness of the second layer in the first direction. In the following description, contents which overlap those in the first embodiment are partially omitted from description.

Figure 8:
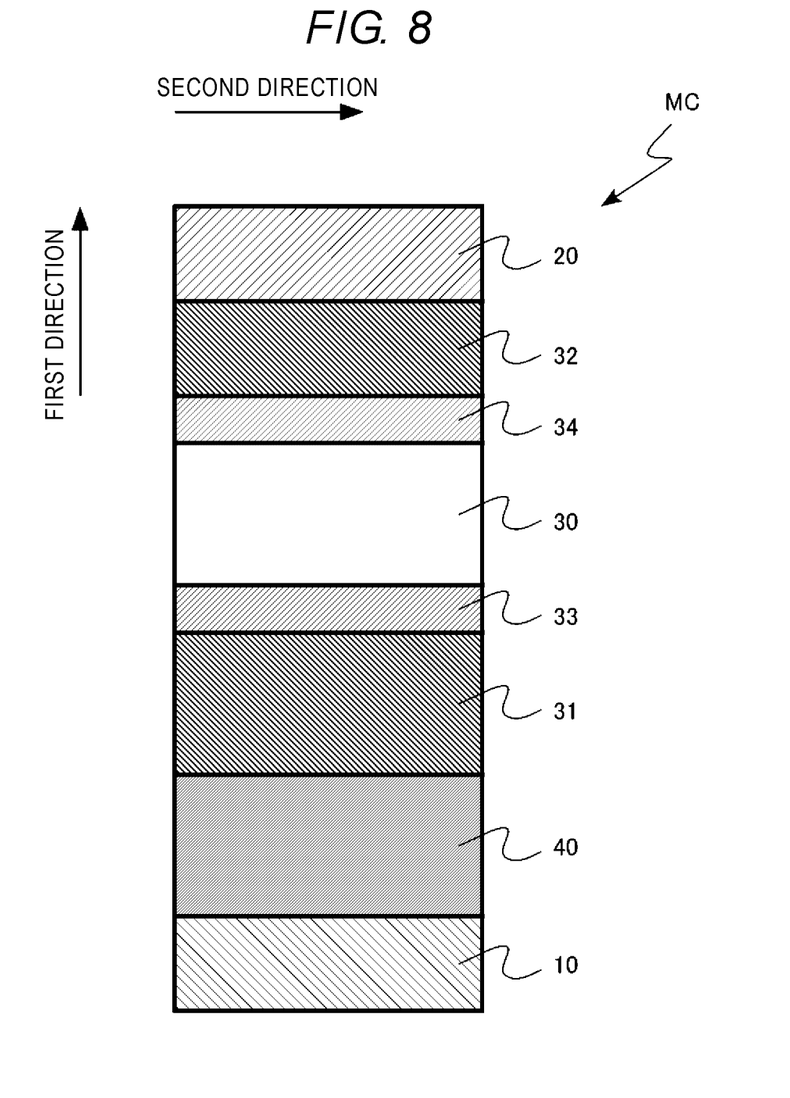
FIG. 8 is a schematic sectional view of a memory cell of a storage device according to a third embodiment.

FIG. 8 is a schematic sectional view of a memory cell of the storage device according to the third embodiment. FIG. 8 illustrates a cross-section of one memory cell MC, which is indicated by, for example, a dotted line circle, in the memory cell array 100 illustrated in FIG. 1.

The memory cell MC includes, as illustrated in FIG. 8, a lower electrode 10 (i.e., a first conductive layer), an upper electrode 20 (i.e., a second conductive layer), a resistance-variable element 30, a first thermal shield layer 31 (i.e., a first layer), a second thermal shield layer 32 (i.e., a second layer), a first interfacial layer 33 (i.e., a third layer), a second interfacial layer 34 (i.e., a fourth layer), and a switching element 40.

The thickness of the first thermal shield layer 31 in the first direction is greater than the thickness of the second thermal shield layer 32 in the first direction. The thickness of the first thermal shield layer 31 in the first direction is 1.1 times or more and 2 times or less the thickness of the second thermal shield layer 32 in the first direction.

Increasing the thickness of the first thermal shield layer 31 enables preventing or reducing a rise in temperature of the switching element 40 occurring during the resetting operation and the setting operation. Accordingly, a property fluctuation of the switching element 40 caused by a rise in temperature thereof can be prevented or reduced.

As described above, according to the storage device in the third embodiment, a storage device with an improved endurance property can be attained. Moreover, a property fluctuation of the switching element can be prevented or reduced.

Fourth Embodiment

A storage device in a fourth embodiment differs from that in the first embodiment in that, when the direction perpendicular to the first direction is defined as a second direction, the width of the resistance-variable element in the second direction is less than each of the width of the third layer in the second direction and the width of the fourth layer in the second direction. In the following description, contents which overlap those in the first embodiment are partially omitted from description.

Figure 9:
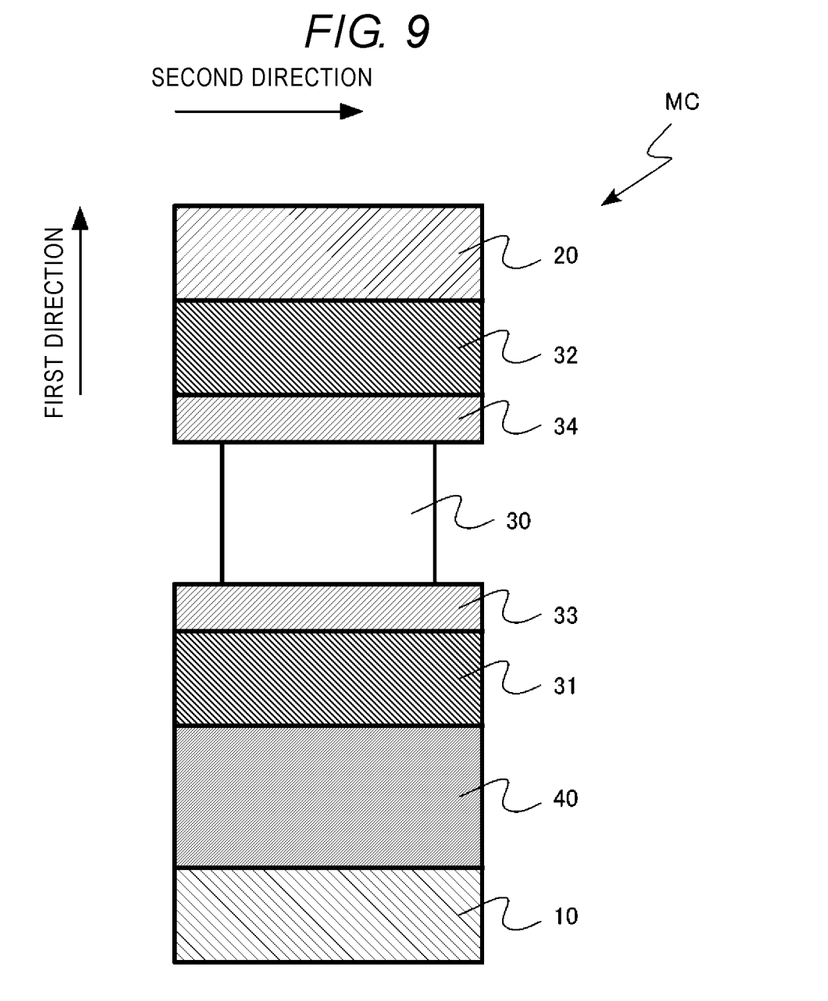
FIG. 9 is a schematic sectional view of a memory cell of a storage device according to a fourth embodiment.

FIG. 9 is a schematic sectional view of a memory cell of the storage device according to the fourth embodiment. FIG. 9 illustrates a cross-section of one memory cell MC, which is indicated by, for example, a dotted line circle, in the memory cell array 100 illustrated in FIG. 1.

The memory cell MC includes, as illustrated in FIG. 9, a lower electrode 10 (i.e., a first conductive layer), an upper electrode 20 (i.e., a second conductive layer), a resistance-variable element 30, a first thermal shield layer 31 (i.e., a first layer), a second thermal shield layer 32 (i.e., a second layer), a first interfacial layer 33 (i.e., a third layer), a second interfacial layer 34 (i.e., a fourth layer), and a switching element 40.

The width of the resistance-variable element 30 in the second direction is less than each of the width of the first interfacial layer 33 in the second direction and the width of the second interfacial layer 34 in the second direction. The difference between the resistance-variable element 30 in the second direction and each of the width of the first interfacial layer 33 in the second direction and the width of the second interfacial layer 34 in the second direction is, for example, 0.2 nm or more and 6 nm or less.

In processing a stacked structure between the lower electrode 10 and the upper electrode 20 by etching, for example, selectively performing isotropic etching on the resistance-variable element 30 enables narrowing the width of the resistance-variable element 30.

Making the width of the resistance-variable element 30 less than each of the widths of the first interfacial layer 33 and the second interfacial layer 34 reduces the volume of the resistance-variable element 30. Accordingly, it becomes possible to reduce a resetting current.

As described above, according to the storage device in the fourth embodiment, a storage device with a resetting current further reduced can be attained.

While, in the above-described third and fourth embodiments, a case where each of the first interfacial layer 33 and the second interfacial layer 34 is a layer including tungsten nitride with a nitrogen concentration of 10 atomic percent or more and 25 atomic percent or less is described as an example, each of the first interfacial layer 33 and the second interfacial layer 34 may be a layer including tungsten carbide with a carbon concentration of 4 atomic percent or more and 20 atomic percent or less.

While, in the above-described first to fourth embodiments, a memory cell array having a structure in which word lines and bit lines are arranged in such away as to extend in parallel with the surface of a semiconductor substrate is described as an example, for example, the present disclosure can be applied to a memory cell array having a structure in which bit lines are arranged perpendicularly to the surface of a semiconductor substrate.

While, in the above-described first to fourth embodiments, a case where the first thermal shield layer 31 and the switching element 40 are in direct contact with each other is described as an example, for example, an intermediate layer which includes metal may be provided between the first thermal shield layer 31 and the switching element 40.

While, in the above-described first to fourth embodiments, a case where the second thermal shield layer 32 and the upper electrode 20 are indirect contact with each other is described as an example, for example, an intermediate layer which includes metal may be provided between the second thermal shield layer 32 and the upper electrode 20.

While, in the above-described first to fourth embodiments, a case where the resistance-variable element is a chalcogen film which includes germanium (Ge), antimony (Sb), and tellurium (Te) is described as an example, the chalcogen film may further include indium (In).

While, in the above-described first to fourth embodiments, a case where the switching element is provided between the resistance-variable element and the lower electrode is described as an example, the switching element may be provided between the resistance-variable element and the upper electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a first conductive layer;
a second conductive layer;
a resistance-variable layer, provided between the first conductive layer and the second conductive layer, that includes germanium (Ge), antimony (Sb), and tellurium (Te);
a first layer, provided between the resistance-variable layer and the first conductive layer, that primarily includes carbon;
a second layer, provided between the resistance-variable layer and the second conductive layer, that primarily includes carbon;
a third layer, provided between the resistance-variable layer and the first layer, that includes at least one of tungsten nitride with a nitrogen concentration of 10 atomic percent or more and 25 atomic percent or less and tungsten carbide with a carbon concentration of 4 atomic percent or more and 20 atomic percent or less; and
a fourth layer, provided between the resistance-variable layer and the second layer, that includes at least one of tungsten nitride with a nitrogen concentration of 10 atomic percent or more and 25 atomic percent or less and tungsten carbide with a carbon concentration of 4 atomic percent or more and 20 atomic percent or less.

2. The storage device according to claim 1, further comprising a switching layer, provided between the first layer and the first conductive layer, that includes germanium (Ge), selenium (Se), and arsenic (As).

3. The storage device according to claim 2, wherein a thickness of the first layer along a first direction, along which the first conductive layer is disposed over the second conductive layer, is greater than a thickness of the second layer along the first direction.

4. The storage device according to any one of claim 3, wherein a width of the resistance-variable layer along a second perpendicular to the first direction is less than both a width of the third layer along the second direction and a width of the fourth layer along the second direction.

5. The storage device according to claim 1, wherein each of a carbon concentration of the first layer and a carbon concentration of the second layer is 90 atomic percent or more.

6. A storage device comprising:
a plurality of first wirings;
a plurality of second wirings intersecting with the plurality of first wirings; and
a plurality of memory cells respectively located at regions where one of the second wirings intersects with one of the first wirings,
wherein each of the memory cells includes:
a first conductive layer;
a second conductive layer;

a resistance-variable layer, provided between the first conductive layer and the second conductive layer, that includes germanium (Ge), antimony (Sb), and tellurium (Te);

a first layer, provided between the resistance-variable element and the first conductive layer, that primarily includes carbon;

a second layer, provided between the resistance-variable element and the second conductive layer, that primarily includes carbon;

a third layer, provided between the resistance-variable layer and the first layer, that includes at least one of tungsten nitride with a nitrogen concentration of 10 atomic percent or more and 25 atomic percent or less and tungsten carbide with a carbon concentration of 4 atomic percent or more and 20 atomic percent or less; and a fourth layer, provided between the resistance-variable layer and the second layer, that includes at least one of tungsten nitride with a nitrogen concentration of 10 atomic percent or more and 25 atomic percent or less and tungsten carbide with a carbon concentration of 4 atomic percent or more and 20 atomic percent or less.

7. The storage device according to claim 6, further comprising a switching layer, provided between the first layer and the first conductive layer, that includes germanium (Ge), selenium (Se), and arsenic (As).

8. The storage device according to claim 7, wherein a thickness of the first layer in a first direction, along which the first conductive layer is disposed over the second conductive layer, is greater than a thickness of the second layer along the first direction.

9. The storage device according to claim 8, wherein a width of the resistance-variable layer in a second direction, perpendicular to the first direction, is less than each of a width of the third layer along the second direction and a width of the fourth layer along the second direction.

10. The storage device according to claim 6, wherein each of a carbon concentration of the first layer and a carbon concentration of the second layer is 90 atomic percent or more.

11. The storage device according to claim 1, wherein the carbon concentration of tungsten carbide of each of the third layer and fourth layer is 5 atomic percent or more and 18 atomic percent or less.

12. The storage device according to claim 1, wherein a carbon concentration of each of the first and second layer is 95 atomic percent or more.

13. The storage device according to claim 1, wherein a thickness of the first layer along the first direction is 1.1 times or more and 2 times or less than a thickness of the second layer along the first direction.

* * * * *